(12) United States Patent  (10) Patent No.: US 7,791,352 B2
Nasswetter  (45) Date of Patent: Sep. 7, 2010

(54) GENERATOR REGULATOR HAVING A DIAGNOSTIC FUNCTION FOR SEMICONDUCTOR COMPONENTS

(75) Inventor: Guenter Nasswetter, Gomaringen (DE)

(73) Assignee: Robert Bosch GMBH, Stuttgart (DE)

( * ) Notice: Subject to any disclaimer, the term of this patent is extended or adjusted under 35 U.S.C. 154(b) by 534 days.

(21) Appl. No.: 11/629,276

(22) PCT Filed: Apr. 22, 2005

(86) PCT No.: PCT/EP2005/051794

§ 371 (c)(1),
(2), (4) Date: Jul. 30, 2007

(87) PCT Pub. No.: WO2005/122388

PCT Pub. Date: Dec. 22, 2005

(65) Prior Publication Data

US 2007/0290690 A1    Dec. 20, 2007

(30) Foreign Application Priority Data

Jun. 9, 2004    (DE) ....................... 10 2004 028 213

(51) Int. Cl.
*G01R 31/14* (2006.01)
(52) U.S. Cl. .............................. 324/511; 361/42; 361/85
(58) Field of Classification Search .................. 324/511
See application file for complete search history.

(56) References Cited

U.S. PATENT DOCUMENTS

| 5,126,678 | A | * | 6/1992 | Williams ..................... 324/545 |
| 6,147,474 | A | * | 11/2000 | Koss et al. ..................... 322/59 |
| 6,236,947 | B1 | * | 5/2001 | Dowling et al. ............... 702/38 |
| 6,308,140 | B1 | * | 10/2001 | Dowling et al. ............... 702/60 |
| 6,404,163 | B1 | * | 6/2002 | Kapsokavathis et al. .... 320/104 |
| 2003/0006740 | A1 | | 1/2003 | Henkel et al. |

FOREIGN PATENT DOCUMENTS

| DE | 31 04 121 | 9/1982 |
| DE | 43 08 769 | 9/1994 |
| DE | 100 05 183 | 8/2001 |
| JP | 08 065914 | 3/1996 |

* cited by examiner

*Primary Examiner*—Timothy J Dole
*Assistant Examiner*—Benjamin M Baldridge
(74) *Attorney, Agent, or Firm*—Kenyon & Kenyon LLP

(57) ABSTRACT

A method for detecting a fault in semiconductor components in electrical machines, e.g., three-phase generators, used in the automotive field is described. The electrical machine is equipped with multiple windings, each having a phase terminal U, V, W. The electrical machine is checked by determining the voltage in one of its phase terminals U, V, W both during operation and at rest. The phase terminals of phase terminals U, V, W of the electrical machine that are not taken into account are checked for voltage dips with respect to a potential or are checked for the output currents.

12 Claims, 4 Drawing Sheets

GENERATOR REGULATOR HAVING A DIAGNOSTIC FUNCTION FOR SEMICONDUCTOR COMPONENTS

FIELD OF THE INVENTION

Generators such as the three-phase generators used in motor vehicles are equipped with diodes for rectification of the output current.

BACKGROUND INFORMATION

All three phase terminals U, V, and W are connected in the positive direction to the positive pole of the motor vehicle battery via the diodes and to ground with one diode in the reverse direction. Electronic regulators used to regulate the output voltage of three-phase generators require information about whether the generator is operating and, if so, at which rotational speed. This rotational speed information is obtained by observing one or more phase terminals of the generator.

German Published Patent Application No. 43 08 769 relates to a method for monitoring and protecting high-current diodes. In the method known from German Published Patent Application No. 43 08 769, which is used in welding systems in particular, the high-current diodes are monitored by determining the temperature of the diodes by simulating the temperature of the diodes electrically by an analog method, preferably via an RC network. A comparison with a reference signal corresponding to a maximum allowed temperature of the high-current diodes is performed. First, the current flowing through the high-current diodes is detected, and then a current corresponding to the measured value is applied to a measuring line. A voltage is generated, allowing the thermal response of the high-current diode to be visualized by using an RC network. The simulated voltage is ascertained using a preselectable reference voltage; in the case when the simulated voltage exceeds the preselectable reference voltage, an error signal is generated. A system for implementing the method includes an ammeter that measures the current flowing across the high-current diode and maps a measuring signal. Furthermore, the arrangement includes a controlled current source which applies a current corresponding to the measuring signal delivered by the ammeter to a measuring line and an RC network block, which applies a voltage simulating the thermal response of the high-current diode to the measuring line. Finally, a monitoring circuit is provided and delivers a signal when the voltage applied to the measuring line exceeds a preselectable reference value.

A rectifier is known from German Published Patent Application No. 100 05 183. This rectifier includes semiconductor rectifier elements for rectifying an alternating electric quantity applied to an input u, v, w of the rectifier and an output for picking up the rectified electrical quantity. A fusible cutout is connected between the rectifier elements and the output, the fusible cutout having a semiconductor chip made of the same semiconductor material as the rectifier elements. The semiconductor rectifier elements have rectifier semiconductor chips surrounded by a housing, the semiconductor chip of the fusible cutout being surrounded by a housing having essentially the same design as the housing of the semiconductor rectifier elements.

If one of the diodes of a three-phase generator is defective, whether due to a short-circuit or an interruption, the generator is able to supply only a reduced output current, so an unacceptably high voltage dip may occur when a major electric load is connected to the vehicle electrical system. Electronic regulators are usually used to regulate the output voltage of a three-phase generator and require information about whether the generator is in operation and, if so, at what speed. This rotational speed information is made available by observing one or more of the phase terminals of the three-phase generator. The frequency of the alternating voltage is directly proportional to the rotational speed of the three-phase generator.

All these methods and/or arrangements and devices usually have the disadvantage that the diode faults mentioned above, i.e., a short circuit and/or an interruption, is/are typically either not detected at all or are not detected adequately. Furthermore, according to the approaches outlined above, the design complexity for implementing this design in the regulator or for accommodating the sensors is usually substantial, thus greatly increasing the manufacturing cost.

SUMMARY OF THE INVENTION

With the method proposed according to the present invention, existing diode faults may be detected by testing only one phase terminal, e.g., phase terminal V. These detected faults may either be displayed for the driver of the vehicle or stored in the fault memory of a control unit, from which they are read out via a diagnostic plug of the type used conventionally today. Via targeted shutdown of certain power consuming loads that are not absolutely necessary for basic operation of the vehicle, it is also possible to prevent the voltage from dropping below a critical level.

With the method proposed according to the present invention, it is possible to detect a diode fault in advance before it results in restricted operation or charge balance problems or a loss of comfort with respect to the vehicle's electrical system due to a reduced maximum output power of the generator in the event of a diode fault.

The individual phase terminals of a three-phase generator are conductively interconnected so that they conduct at a low resistance via the generator windings. No voltage is induced in these windings when the three-phase generator is at rest. Since the semiconductor components that are used, namely diodes in the present case, usually have a high resistance in the reverse direction, this yields a potential at the phase terminals which depends on the residual currents of the diodes and the resistive load at the phase terminals of the three-phase generator. During operation, the positive diode becomes conductive in the positive half-wave of a phase voltage and the negative diode becomes conductive in the negative half-wave.

In the event of a diode short-circuit fault, a diode connected to the positive pole of the motor vehicle battery is short-circuited or has a low resistance when the three-phase generator is at rest, so the potential of a phase terminal is at the battery voltage level at rest and cannot be lowered significantly by a defined low resistive load at one of the phase terminals of the three-phase generator. However, if a diode connected to ground is short circuited or has a low resistance, the potential is accordingly at ground and cannot be increased significantly by applying a low resistive load to the positive pole of the motor vehicle battery. In both cases, the fault is detectable by connecting a resistive load, for example, to the positive pole of the motor vehicle battery and to ground, and the resulting voltage potentials in each case may be analyzed.

During operation of the three-phase generator, however, a short circuit of a positive diode to the positive pole of the motor vehicle battery at a phase terminal V causes the potential there to no longer be differentiated from the positive pole of the motor vehicle battery. A short circuit of the negative diode to ground, however, results in a continuously applied ground potential, so that rotational speed information cannot be obtained in either case.

A short circuit of a positive diode to one of the other phase terminals, e.g., U or W, results in a voltage dip at the positive pole of the motor vehicle battery during the negative half-wave of the particular phase, this branch taking up current and thus reducing the output current. A short circuit at the negative diode of the three-phase generator at one of the other phase terminals (U or W) results in a voltage dip during the positive half-wave of the particular phase because no output current is flowing in this period of time.

In the case of a diode interruption at a phase terminal V, the voltage at this terminal is no longer limited by the battery or the vehicle electrical system during the positive half-wave and therefore it may exceed the battery voltage by several volts. However, if the negative diode of phase terminal V of the three-phase generator is interrupted, the voltage in the negative half-wave is no longer limited by the ground potential and may thus fall several volts below the ground potential.

With all the types of faults described above, it is apparent that the phase terminal affected by the fault is unable to deliver an output current to the electrical system of a vehicle, for example. Therefore, the output voltage of the three-phase generator will be lower during this phase than in the other phases.

DETAILED DESCRIPTION

Figure 1:
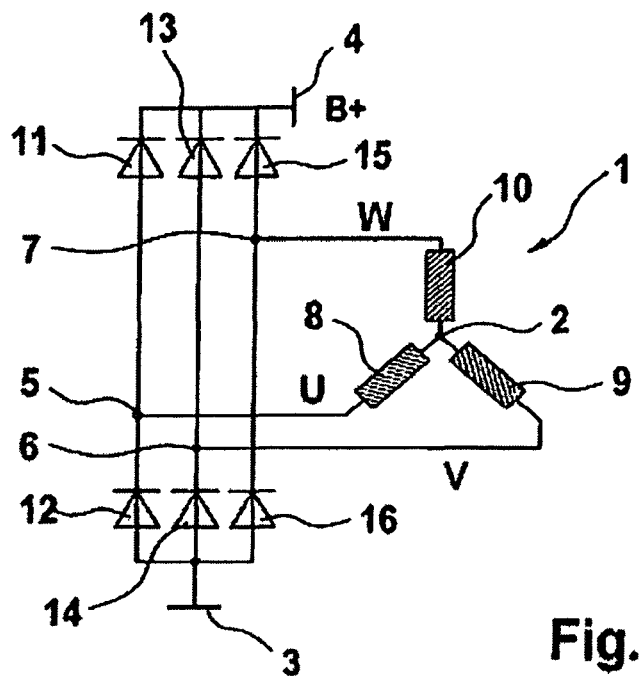
FIG. 1 shows a basic diagram of a three-phase generator.

The diagram in FIG. 1 shows the basic design of a three-phase generator.

A three-phase generator 1 whose U winding 8, V winding 9, and W winding 10 are connected to a generator star point 2 has phase terminals for phases U, V, and W. Each phase U, V, W of three-phase generator 1 is connected to a line that includes positive diodes 11, 13, and 15, acting in the forward direction, and blocking diodes 12, 14, and 16, each acting in the reverse direction. These lines are connected to a positive pole 4 of a battery (potential terminal) and are also connected to ground 3.

Individual phase terminals U, V, W are interconnected so they conduct with a low resistance via generator windings 8, 9, and 10. When three-phase generator 1 is stopped, no voltage is induced in these windings 8, 9, and 10. Semiconductor components 12, 14, 16, preferably diodes, which act in the reverse direction, are usually designed for high resistance, so that a potential that depends on the residual currents of semiconductor components 11, 13, and 15 and the resistive load on phase terminals U, V, W is yielded at phase terminals U, V, W. During operation of the three-phase generator, positive diodes 11, 13, and 15, respectively, become conductive in the positive half-wave of a phase voltage, while semiconductor components 12, 14, and 16, respectively, situated in the reverse direction become conductive in the negative half-wave of a phase voltage.

Figure 2:
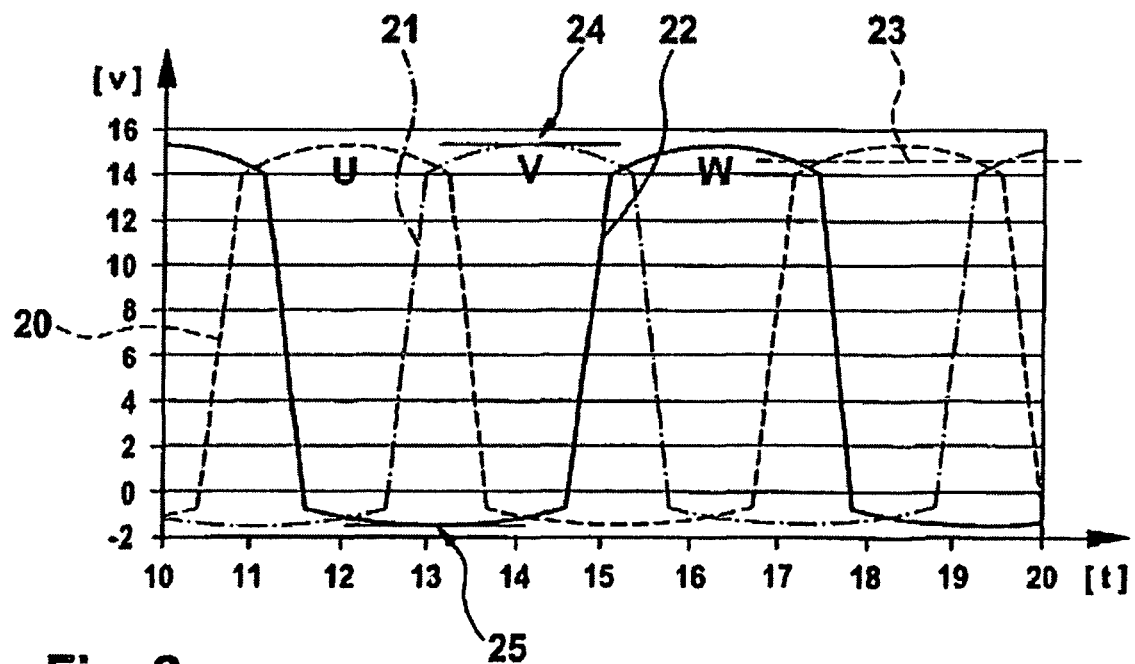
FIG. 2 shows a basic curve of the phase voltages of an electrical machine such as a three-phase generator.

The diagram in FIG. 2 shows the basic curve of the phase voltages in a three-phase generator.

The curves of individual phase voltages 20, 21, and 22, respectively, are plotted as a function of time. It follows from the diagram in FIG. 2 that a vehicle electrical system voltage 23, identified by reference numeral 23, that is subject to fluctuations is maintained as a function of individual voltage maxima 24 of phases U, V, and W. The voltage curve of individual phases U, V, and W of three-phase generator 1 shown in FIG. 2 is established according to the 120° offset of generator windings 8, 9, and 10. Reference numeral 20 indicates the curve of phase voltage U in winding 9 of three-phase generator 1, while reference numeral 21 indicates the curve of phase voltage V. Reference numeral 22 denotes the curve of phase voltage W prevailing in winding 10 of three-phase generator 1.

Individual curves 20, 21, 22 of voltages $U_U$, $U_V$, and $U_W$ fluctuate between above-mentioned voltage maximum 24 and prevailing voltage minimum 25 in particular phase U, V, or W. The diagram of voltage curves according to FIG. 2 reflects the condition in which no faults, e.g., short circuits or interruptions, occur in the lines assigned to phase terminal U, V, W in the three-phase generator diagrammed schematically in FIG. 1 together with semiconductor components 11, 13, and 15 that act in the forward direction as well as semiconductor components 12, 14, and 16 acting in the reverse direction.

Figure 3:
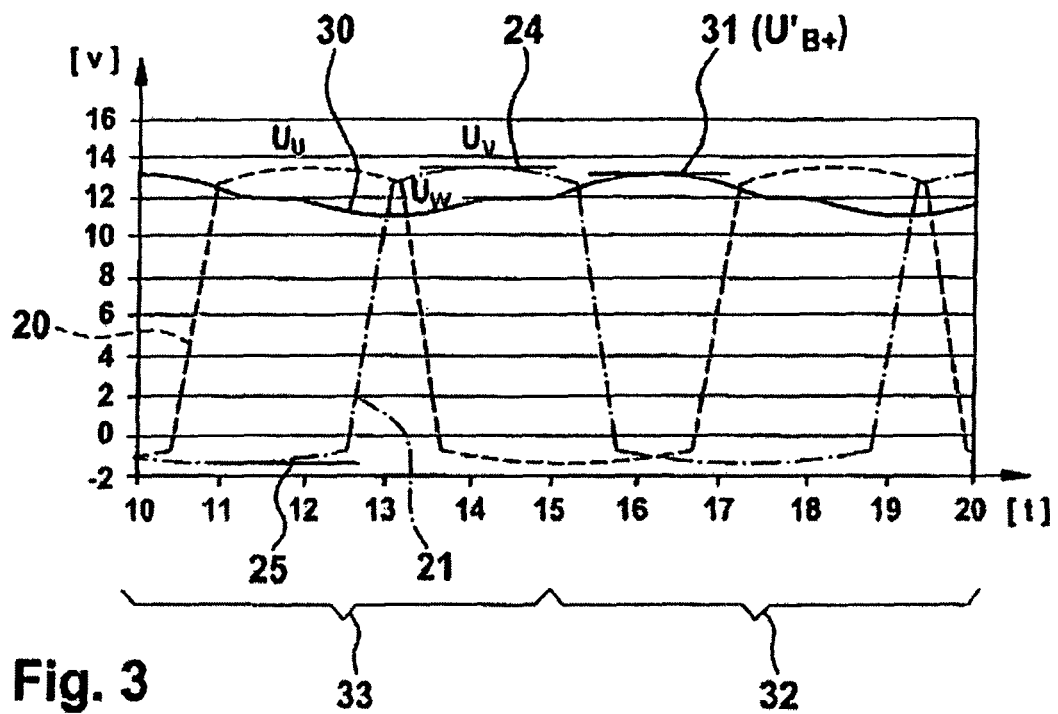
FIG. 3 shows the effect of a short circuit at the positive diode of phase terminal W.
Figure 4:
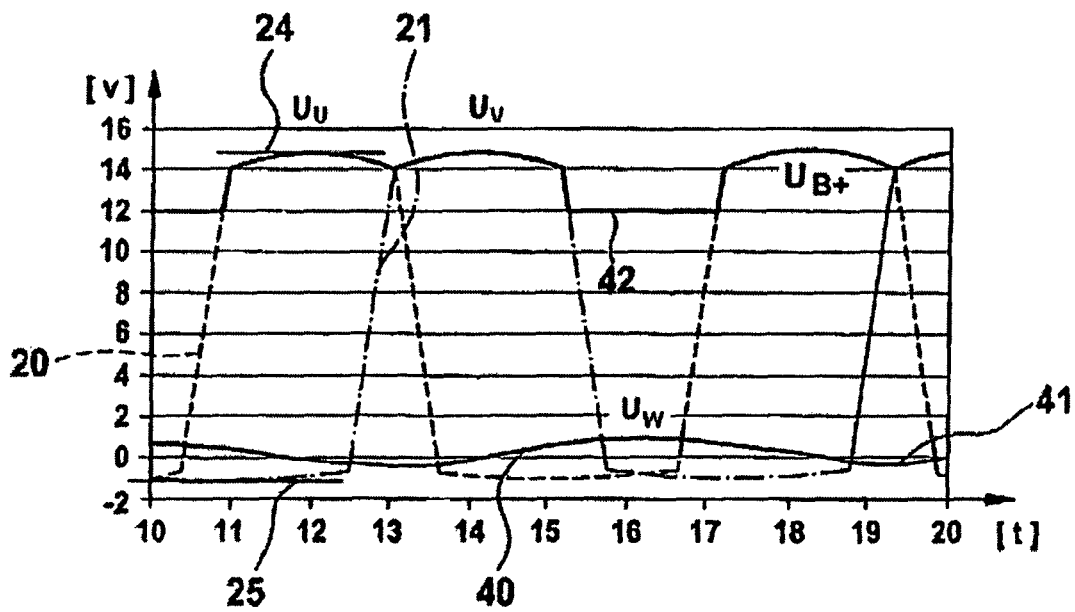
FIG. 4 shows the effect of a short circuit at the negative diode of the phase terminal W.

The diagram according to FIGS. 3 and 4 shows the effects of short circuits in semiconductor components situated in the forward direction of the three-phase generator.

If one of semiconductor components 11, 13, or 15, preferably diodes, connected to positive pole 4 (B+) is short-circuited or has a low resistance, the potential of three-phase generator 1 at rest is at the battery voltage level and may be lowered only to an insignificant extent by loading with a defined low resistive load at one of phase terminals U, V, W.

However, if a semiconductor component 12, 14, or 16 connected to ground 3 is short-circuited or has a low resistance, the potential corresponds to the potential of ground terminal 3 accordingly and cannot be increased significantly by applying a low resistive load to positive pole 4 of the battery (B+).

In both cases outlined above, i.e., in the case of a semiconductor component 11, 13, or 15 connected to positive pole 4 of an motor vehicle battery or in the case of a semiconductor component 12, 14, or 16 connected in the reverse direction, a short circuit in the particular semiconductor component may be detected by connecting a phase terminal to a resistive load, e.g., to positive pole 4 of an motor vehicle battery, or connecting the terminal to ground 3 and subsequently analyzing the resulting voltage potentials.

Although the detection described above is suitable for the case of a stationary three-phase generator 1, one phase terminal U, V, W, e.g., phase terminal V, may be short-circuited during operation of the three-phase generator. A short-circuit in semiconductor component 13 (phase terminal V, where semiconductor component 13 is applied to positive pole 4 of the battery) during operation of the three-phase generator causes the potential to no longer differ from the potential applied to positive pole 4 of the motor vehicle battery (B+). The short circuit of semiconductor component 14, which is in the reverse direction, at phase terminal V to ground potential 3 results in a continuously applied ground potential. As a result, no alternating voltage prevails when the ground potential is always applied and consequently there is no frequency indicating the rotational speed of three-phase generator 1 and therefore rotational speed information is not obtainable at phase terminal V.

During operation of three-phase generator 1, two remaining phase terminals U and W are tested for the occurrence of a short circuit on a semiconductor component 11 or 15 connected in the forward direction and tested during the negative half-wave of particular phase U or W for the occurrence of a voltage dip at positive pole 4 of the battery (B+). Particular phases U and W take up current in this case and therefore reduce the output current, as indicated by the diagram in FIG. 3. The diagram according to FIG. 3 shows that in a short circuit of semiconductor component 15, phase voltage W assumes a minimum during negative half-wave 33; in the diagram according to FIG. 3 this is approximately 11 volts. The peak of voltages $U_U$ and $U_V$ in phases U and V is indicated by reference numeral 24 and occurs at approximately 13.5 volts, while the potential applied to positive pole 4 of the motor vehicle battery (B+), i.e., the battery voltage is approximately 13 volts. The relative differences in voltage values between the individual phase terminals are of interest.

The effects of a short circuit in semiconductor component 16, which is situated in the reverse direction, are indicated by the diagram in FIG. 4. A short circuit in phases U and W in semiconductor component 14 or 16, which is situated in the reverse direction, results in a voltage dip, labeled with reference numeral 42 in FIG. 4, during a positive half-wave 32 of particular phase U or W. An output current cannot be supplied because according to the diagram in FIG. 4, maximum phase voltage U, W (cf. reference numeral 40) is only a few volts, depending on the residual resistance of the short circuit, which is greatly below the voltage of approximately 12 or 24 volts prevailing in the electrical system of a vehicle in general.

For the sake of thoroughness, it should be pointed out that the peaks of phase voltages $U_U$ and $U_V$ are identified by reference numeral 24 and the minima of phase voltages $U_U$ and $U_V$ are identified by reference numeral 25.

Figure 5:
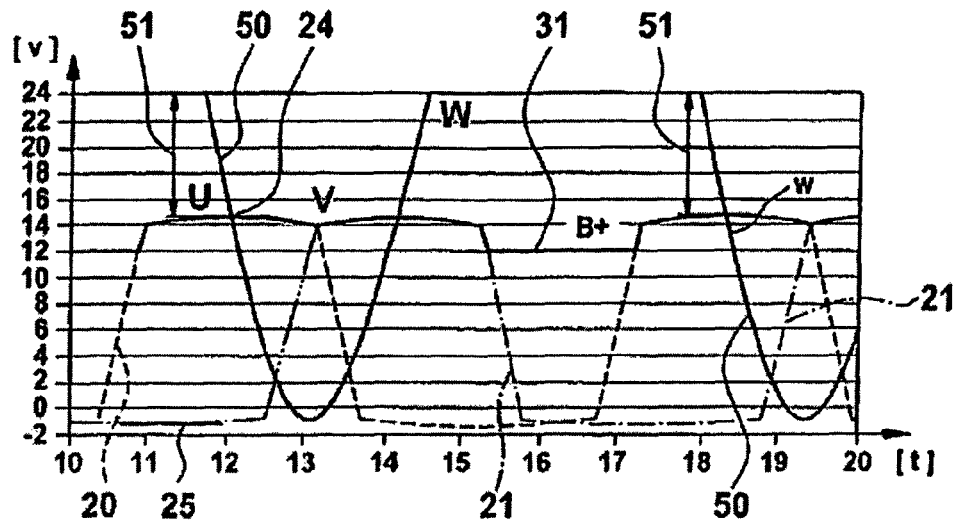
FIG. 5 shows the effect of an interruption in the positive diode at the phase terminal W of the three-phase generator.
Figure 6:
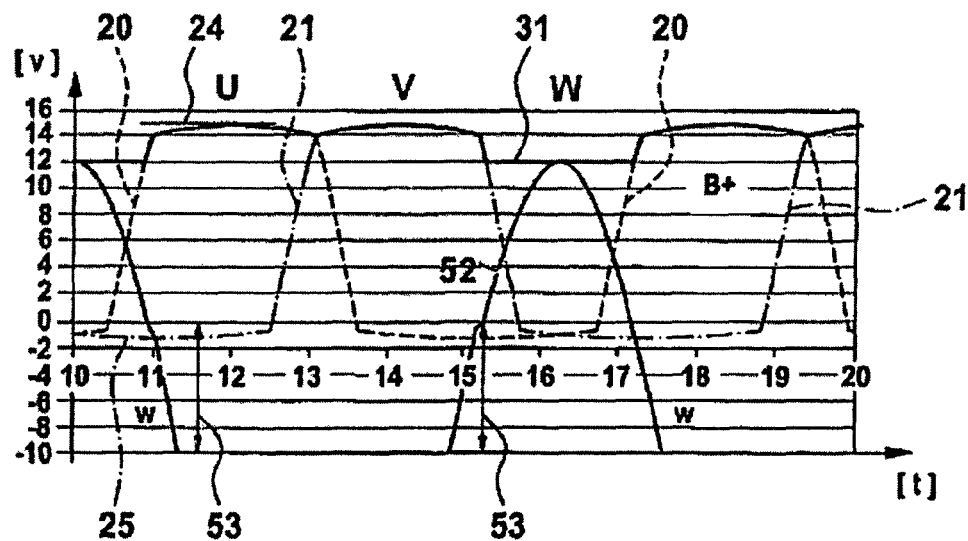
FIG. 6 shows the effect of an interruption at the negative diode in phase terminal W.

In the case of a fault in the form of an interruption in a semiconductor component 11, 12, 13, 14, 15, or 16 in one of phase terminals U, V, W, reference is made to the diagrams according to FIGS. 5 and 6.

If a semiconductor component 11, 13, 15 lying in the forward direction is interrupted, e.g., semiconductor component 15 at phase terminal V, the voltage at this terminal is no longer limited by the motor vehicle battery, i.e., the vehicle electrical system, during positive half-wave 32 and therefore the voltage applied to positive pole 4 of the motor vehicle battery may increase by several volts (as indicated by the curve of phase voltage U, W according to reference numeral 50). The resulting voltage overshoot is indicated by reference numeral 51. The voltage overshoot is greatly above voltage maximum 24 of phase voltage $U_U$ according to curve 20 of phase voltage U. However, if semiconductor component 14 of phase terminal V, which is situated in the reverse direction, is interrupted, the voltage during negative half-wave 33 is no longer limited by the potential of ground terminal 3, so that for this case (according to voltage curve 52 shown in FIG. 6 for phase voltage U, W) voltage U, W may fall below the ground potential by several volts, as indicated by voltage drop 53 according to the diagram in FIG. 6.

If semiconductor components 11 and 15, which are situated in the forward direction, as well as semiconductor components 12 and 16, which are situated in the reverse direction, of phase terminals U and W are interrupted, phases U or W, each being subject to an interruption, also may not deliver any current to the electrical system of a vehicle.

All the types of faults depicted here, whether short circuits occurring in the area of semiconductor components 11, 13, 15, which are situated in the forward direction, or semiconductor components 12, 14, 16, which are situated in the reverse direction, or interruptions in the semiconductor components, have in common the fact that phase terminal U or V or W affected by the particular fault is unable to deliver an output current to the vehicle electrical system. Because of this circumstance, the output voltage of the three-phase generator is lower during particular phase U, V, or W than in the other intact phases.

Fault detection will now be described with reference to phase terminal V. If the directly observed phase, i.e., measured phase V, is affected, a simple analysis of the faulty behavior is possible whether three-phase generator 1 is at rest or in operation. When three-phase generator 1 is at rest, phase terminal V is loaded, e.g., by a well-defined load resistance to ground 3 or to positive pole 4 of the motor vehicle battery (B+). If there are potentials which are definitely different from the potential of ground terminal 3 or the potential of positive pole 4 of the motor vehicle battery (B+), a short circuit has presumably occurred in at least one semiconductor component 11, 13, 15 to positive pole 4 of the battery or a short circuit of a semiconductor component 12, 14, 16 to ground terminal 3.

During operation of the three-phase generator, phase voltage $U_V$ in phase V is fixed in the case of a short circuit at the potential of positive pole 4 of the motor vehicle battery (B+) or at the potential of ground terminal 3 and thus does not allow a frequency analysis for lack of a frequency of an alternating voltage.

An interruption in a semiconductor component—i.e., semiconductor component 13 or 14 with respect to phase V—results in easy-to-detect voltage curves, as indicated above, which either run clearly above the potential of positive pole 4 of an motor vehicle battery according to the diagrams in FIGS. 5 and 6 or clearly below the potential of ground terminal 3 (cf. reference numeral 51 in FIG. 5 and reference numeral 53 in FIG. 6).

Figure 7:
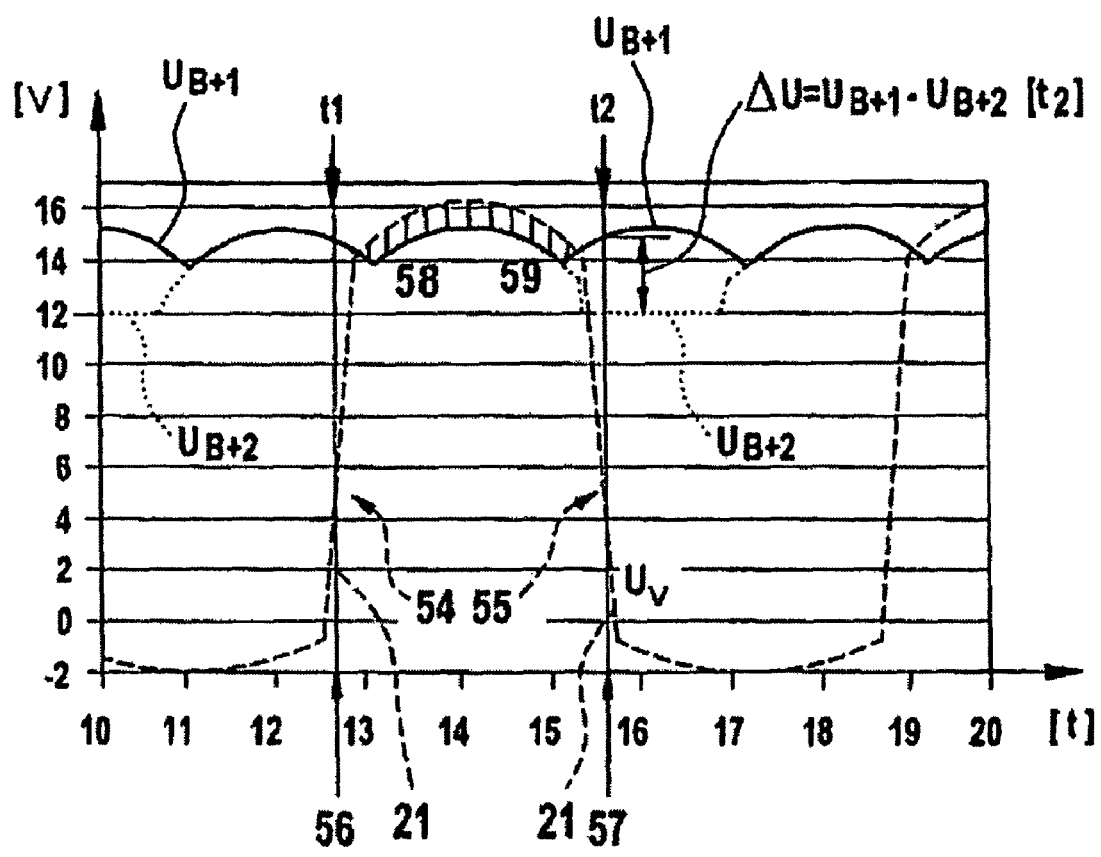
FIG. 7 shows the effect of a diode fault on the generator output voltage of a three-phase generator.

When observing phase V, no output current is able to flow in remaining phases U or W during positive half-wave 32 of particular affected phase U, W, depending on the site of the fault, either in phase U or in phase W, resulting in reduced output voltages 58 and 59 as shown in FIG. 7.

Since leading edge 54 of phase voltage $U_V$ of phase V and trailing edge 55 of phase voltage $U_V$ in phase V coincide with positive half-wave 32 of phase voltage curves 20 and 22, respectively, voltages $U_{B+1}$ and $U_{B+2}$ are detectable at positive pole 4 of the motor vehicle battery (B+) at respective defined instants $t_1$ and $t_2$ of leading edge 54 and trailing edge 55 of voltage $U_V$ (see reference numeral 21 in FIG. 7). The detected voltages may be compared. A fault in a semiconductor element is probable when a difference between voltages $U_{B+1}$, $U_{B+2}$, detected at detection intervals $t_1$ (56), $t_2$ (57) during a plurality of successive detection instants, exceeds a defined limiting value. Voltage curve $U_{B+1}$ in phase W coincides with the battery voltage level for the case when no fault in the form of failure of the semiconductor component has occurred in phase W. Voltage curve $U_{B+2}$ in phase W denotes the case in which a fault has occurred in phase W. Consequently, a lower output voltage is established in phase W in comparison with an undamaged phase W: $\Delta U = U_{B+1} - U_{B+2}$ ($t_2$). The measured phase is phase V.

Similarly, at instant $t_1$ (reference numeral 56) a comparison of voltages in phase U may be performed in which—as described above—phase voltages in phase U may be compared, as a result of which a fault in phase U may be assumed in a similar manner. The voltage curve in phase W is indicated with a dotted line in the diagram according to FIG. 7, while the voltage curve in phase W occurring at $U_{B+1}$ is indicated with a solid line.

The method according to the present invention for detecting faults in semiconductor components 11, 12, 13, 14, 15, 16 on a three-phase generator at low rotational speeds and low generator load may be performed in an advantageous manner. Ripples in three-phase generator output voltages occurring at high rotational speeds and at high loads of three-phase generator 1 influence detection of a voltage difference due to the reverse recovery performance of semiconductor components 11, 12, 13, 14, 15, and 16. Furthermore, external connection of the vehicle electrical system for detection of a voltage difference ΔU must be taken into account in a case when a plurality of electric loads is connected.

To transmit the detected fault, a fault display may be activated. Furthermore, there is the possibility of setting a fault flag which may be read out via a (data) interface by a control unit. On the other hand, it is also possible to output a fault actively via an interface for transmission of the fault. The method proposed according to the present invention and described above offers the opportunity of detecting a fault in a semiconductor component 11, 12, 13, 14, 15, 16 at an early point in time even before the occurrence of any restriction in operation of the vehicle electrical system, charge balance problems with respect to the motor vehicle battery or comfort restrictions due to the reduced maximum output current of the three-phase generator.

LIST OF REFERENCE NUMERALS

1 Three-phase generator
2 Generator star point
3 Ground potential terminal
4 Terminal of positive pole of battery (B+)
5 U phase terminal
6 V phase terminal
7 W phase terminal
8 U winding
9 V winding
10 W winding
11 U positive diode
12 U blocking diode
13 V positive diode
14 V blocking diode
15 W positive diode
16 W blocking diode
20 Phase U voltage curve
21 Phase V voltage curve
22 Phase W voltage curve
23 Vehicle electrical system voltage
24 Voltage maxima per phase
25 Voltage minima per phase
30 Short-circuit voltage UW (positive diode)
31 Battery voltage UB+
32 Positive half-wave
33 Negative half-wave
40 Short-circuit voltage UW (blocking diode)
41 Ground potential
42 Voltage dip
50 Phase voltage UW during an interruption (positive diode)
51 Voltage overshoot
52 Phase voltage UW during an interruption (negative diode)
53 Voltage drop
54 Leading edge of phase voltage UV
55 Trailing edge of phase voltage UV
56 First point in time (t1)
57 Second point in time (t2)
UB+1 Output voltage without fault in phase W
UB+2 Output voltage with fault in phase W

What is claimed is:

1. A method for detecting faults in semiconductor components in electrical machines corresponding to three-phase generators and having multiple windings and multiple phase terminals, comprising the method steps:
   a) putting one of the phase terminals under a load to ground, or to a higher potential, and measuring a resulting phase terminal potential, to detect short circuits to a positive pole of a battery (B+) or to ground when the electrical machine is at rest;
   b) measuring one of a plurality of voltages in one of the phase terminals to detect the presence of ground potential or a potential of the positive pole (B+) of the battery at the one of the phase terminals, to detect short circuits to the positive pole (B+) of the battery or to ground during operation of the electric machine;
   c) measuring one of the plurality of voltages in one of the phase terminals to ascertain whether the one of the plurality of voltages falls below a defined minimum value or exceeds a defined maximum value, to detect interruptions during operation of the electrical machine;
   d) detecting, in a single measured phase terminal, particular voltage values at defined times corresponding to a point on the leading edge and a point on the trailing edge of the measured voltage, and comparing the two detected voltage values to produce a difference value, which is compared to a limiting value, and if the difference value is greater than the limiting value, determining the existence of a fault condition; and
   e) storing the detected faults in a fault memory of a control unit which is read out via a diagnostic plug.

2. The method as recited in claim 1, wherein fault detection is performed at low rotary speeds and low loads of the three-phase generator.

3. The method as recited in claim 1, wherein any of the phase terminals not previously chosen for measurement are checked for reduced output voltages during a positive half-wave.

4. The method as recited in claim 1, wherein the measured voltage is detected in step (b) at the one of the phase terminals having the potential of the positive pole of the battery over a plurality of successive detection time.

5. The method as recited in claim 1, wherein according to method step b) for detecting a fault in a semiconductor component in the forward direction in the other phase terminals, one or more terminals are checked for a voltage dip at the one of the phase terminals having the potential of the positive pole of the battery during a negative half-wave in the measured phase terminal.

6. The method as recited in claim 1, wherein according to method step b) for detecting a fault in a semiconductor component situated in the reverse direction, the other phase terminals are checked for a voltage dip during a positive half-wave in the measured phase terminal.

7. The method as recited in claim 1, wherein according to method step c), an output current that flows over the phase terminals not previously chosen for measurement is measured.

8. The method as recited in claim 1, wherein the detected faults are displayed to a driver through a direct interface.

9. An electrical machine including a circuit arrangement for detecting faults in semiconductor components, the machine comprising:
- a three-phase generator having a plurality of windings;
- a generator star point having a plurality of phase terminals, the star point connected to the three-phase generator through the windings and the phase terminals being interconnected with each other to conduct a low resistance with the windings;
- multiple sets of positive diodes, each set of positive diodes connected to one of the phase terminals;
- multiple sets of blocking diodes, each set of blocking diodes connected to one of the phase terminals; and
- an arrangement for detecting voltages at least one of the phase terminals, the arrangement comparing, at defined times corresponding to a point on the leading edge and a point on the trailing edge of the measured voltage, on a single measured phase terminal, the voltages detected at the defined times, wherein the two detected voltages are compared to produce a difference value which is compared to a limiting value, and the existence of a fault condition is determined as a result of the comparison of the difference value and the limiting value.

10. The machine as recited in claim 9, wherein the positive diodes act in a forward direction.

11. The machine as recited in claim 9, wherein the blocking diodes act in a reverse direction.

12. The machine as recited in claim 9, wherein the phase terminals are connected in a positive direction to a positive pole of a battery.

* * * * *